United States Patent
Daimon et al.

(10) Patent No.: US 11,621,687 B2
(45) Date of Patent: Apr. 4, 2023

(54) ACOUSTIC WAVE DEVICE

(71) Applicant: Murata Manufacturing Co., Ltd., Nagaokakyo (JP)

(72) Inventors: Katsuya Daimon, Nagaokakyo (JP); Yasumasa Taniguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 801 days.

(21) Appl. No.: 16/566,987

(22) Filed: Sep. 11, 2019

(65) Prior Publication Data
US 2020/0007107 A1 Jan. 2, 2020

Related U.S. Application Data

(63) Continuation of application No. PCT/JP2018/010227, filed on Mar. 15, 2018.

(30) Foreign Application Priority Data

Mar. 23, 2017 (JP) .............................. JP2017-057275

(51) Int. Cl.
*H03H 9/02* (2006.01)
*H03H 9/25* (2006.01)
*H03H 9/00* (2006.01)

(52) U.S. Cl.
CPC ...... *H03H 9/0009* (2013.01); *H03H 9/02574* (2013.01); *H03H 9/25* (2013.01)

(58) Field of Classification Search
CPC .................................. H03H 9/02; H03H 9/25
See application file for complete search history.

(56) References Cited

U.S. PATENT DOCUMENTS

| 8,698,578 B2* | 4/2014 | Nakanishi .......... H03H 9/14526 333/133 |
| 9,035,725 B2* | 5/2015 | Komatsu ............ H03H 9/02858 333/193 |

(Continued)

FOREIGN PATENT DOCUMENTS

| JP | 2009-159039 A | 7/2009 |
| JP | 2013-518455 A | 5/2013 |

(Continued)

OTHER PUBLICATIONS

Official Communication issued in International Patent Application No. PCT/JP2018/010227, dated Jun. 5, 2018.

*Primary Examiner* — Hafizur Rahman
*Assistant Examiner* — Alan Wong
(74) *Attorney, Agent, or Firm* — Keating & Bennett, LLP

(57) ABSTRACT

In an acoustic wave device, an interdigital transducer electrode is disposed on a piezoelectric substrate with a reverse velocity surface having an elliptic shape, and a dielectric film is disposed to cover the interdigital transducer electrode. Assuming an electrode density (%) of the interdigital transducer electrode to be y (%) and a wavelength-normalized film thickness $100h/\lambda$ (%) of the interdigital transducer electrode to be x (%), the wavelength-normalized film thickness x of the interdigital transducer electrode takes a value not less than x satisfying $y=0.3452x^2-6.0964x+36.262$ depending on the electrode density of the interdigital transducer electrode.

19 Claims, 10 Drawing Sheets

(56) References Cited

U.S. PATENT DOCUMENTS

| | | | |
|---|---|---|---|
| 9,065,424 B2* | 6/2015 | Nakanishi | H03H 9/02559 |
| 9,136,458 B2* | 9/2015 | Komatsu | H03H 9/02992 |
| 9,391,256 B2* | 7/2016 | Ruile | H03H 9/02858 |
| 9,431,996 B2* | 8/2016 | Watanabe | H01L 41/22 |
| 10,355,668 B2* | 7/2019 | Iwaki | H03H 9/1457 |
| 2013/0051588 A1 | 2/2013 | Ruile et al. | |
| 2013/0249647 A1 | 9/2013 | Nakanishi et al. | |
| 2013/0285768 A1* | 10/2013 | Watanabe | H03H 3/02 333/193 |
| 2014/0285287 A1 | 9/2014 | Komatsu et al. | |
| 2015/0102705 A1 | 4/2015 | Iwamoto et al. | |

FOREIGN PATENT DOCUMENTS

| | | |
|---|---|---|
| JP | 2013-544041 A | 12/2013 |
| JP | 2014-187568 A | 10/2014 |
| JP | 2015-111923 A | 6/2015 |
| WO | 2013/191122 A1 | 12/2013 |

* cited by examiner

ACOUSTIC WAVE DEVICE

CROSS REFERENCE TO RELATED APPLICATIONS

This application claims the benefit of priority to Japanese Patent Application No. 2017-057275 filed on Mar. 23, 2017 and is a Continuation Application of PCT Application No. PCT/JP2018/010227 filed on Mar. 15, 2018. The entire contents of each application are hereby incorporated herein by reference.

BACKGROUND OF THE INVENTION

1. Field of the Invention

The present invention relates to an acoustic wave device utilizing a Rayleigh wave.

2. Description of the Related Art

In an acoustic wave device utilizing a Rayleigh wave, it has hitherto been demanded to suppress a ripple in a transverse mode. An acoustic wave device disclosed in Japanese Unexamined Patent Application Publication No. 2015-111923, for example, tries to suppress the transverse mode ripple by reducing an acoustic velocity in edge regions. More specifically, in a region where first and second electrode fingers overlap with each other in a propagation direction of an acoustic wave, the edge regions are formed at both ends in an extension direction of the electrode fingers. A film thickness of a dielectric film in the edge regions is set to be thicker than that of the dielectric film in a central region sandwiched between the edge regions. As a result, the acoustic velocity in the edge regions is reduced.

Up to now, the mass of an interdigital transducer (IDT) electrode has been increased by increasing the thickness of the laminated dielectric film. Thus, it has been thought that the acoustic velocity can be reduced by increasing the thickness of the laminated dielectric film.

However, the inventors of preferred embodiments of the present invention discovered that, in a case where the interdigital transducer electrode has a large thickness, the acoustic velocity increases contrary to the intention when the film thickness of the dielectric film in the edge regions is increased. If the acoustic velocity in the edge regions increases relatively, the transverse mode cannot be suppressed.

SUMMARY OF THE INVENTION

Preferred embodiments of the present invention provide acoustic wave devices in each of which an acoustic velocity in edge regions is able to be sufficiently reduced even with an interdigital transducer electrode having a large thickness.

A preferred embodiment of the present invention provides an acoustic wave device including a piezoelectric substrate with a reverse velocity surface having an elliptic shape, an interdigital transducer electrode disposed on or above the piezoelectric substrate, and a dielectric film disposed on the piezoelectric substrate to cover the interdigital transducer electrode, the acoustic wave device utilizing a Rayleigh wave. The interdigital transducer electrode includes first electrode fingers and second electrode fingers interdigitated with the first electrode fingers. Assuming that a direction perpendicular or substantially perpendicular to an extension direction of the first electrode fingers and the second electrode fingers is a propagation direction of an acoustic wave, that a region in which the first electrode fingers and the second electrode fingers overlap with each other when viewed from the propagation direction of the acoustic wave is an intersecting region, that the extension direction of the first electrode fingers and second electrode fingers is an intersecting width direction, and that an electrode density (Mg/m$^3$) of the interdigital transducer electrode is denoted by y (Mg/m$^3$) and a wavelength-normalized film thickness 100h/λ (%) of the interdigital transducer electrode (where h denotes a thickness and λ denotes a wavelength determined by an electrode finger pitch of the interdigital transducer electrode) is denoted by x (%), the wavelength-normalized film thickness x of the interdigital transducer electrode has a value not less than x satisfying y=0.3452x$^2$−6.0964x+36.262 depending on the electrode density y of the interdigital transducer electrode. The intersecting region of the interdigital transducer electrode includes a central region positioned at a center in the intersecting width direction and a first edge region and a second edge region positioned respectively on one outer side and another outer side of the central region in the intersecting width direction, and a film thickness of the dielectric film in each of the first edge region and the second edge region is thinner than a film thickness of the dielectric film in the central region.

In a preferred embodiment of an acoustic wave device according to the present invention, the interdigital transducer electrode is made of Pt, W, Mo, Ta, Au or Cu, and the wavelength-normalized film thickness x (%) of the interdigital transducer electrode is set to be not less than a value denoted in Table 1 below depending on each of materials of the interdigital transducer electrode. In this case, the transverse mode is able to be more effectively reduced or prevented.

TABLE 1

| Material | x = 100 h/λ (%) |
|---|---|
| Pt | ≥3 |
| W | ≥3.5 |
| Mo | ≥8 |
| Ta | ≥4 |
| Au | ≥3.5 |
| Cu | ≥9 |

In a preferred embodiment of an acoustic wave device according to the present invention, the interdigital transducer electrode is made of a multilayer metal film defined by laminating a plurality of metal films, and y in y=0.3452x$^2$−6.0964x+36.262 denotes a density of the multilayer metal film. In this case, the transverse mode ripple is able to be effectively reduced or prevented even when the interdigital transducer electrode made of the multilayer metal film is used.

In a preferred embodiments of an acoustic wave device according to the present invention, regions in which the film thickness of the dielectric film is thicker than the film thickness of the dielectric film in each of the first and second edge regions of the interdigital transducer electrode are positioned on outer sides of the first edge region and the second edge region in the intersecting width direction.

In a preferred embodiment of an acoustic wave device according to the present invention, a first gap region and a second gap region, in which only the first electrode fingers or the second electrode fingers are respectively present, are positioned on the outer sides of the first edge region and the second edge region in the intersecting width direction.

A preferred embodiment of an acoustic wave device according to the present invention further include a first dummy electrode finger including a tip end opposed to a tip end of the first electrode finger with the second gap region interposed therebetween, and a second dummy electrode finger including a tip end opposed to a tip end of the second electrode finger with the first gap region interposed therebetween. The first dummy region and the second dummy region are positioned respectively on outer sides of the first gap region and the second gap region in the intersecting width direction.

In a preferred embodiment of an acoustic wave device according to the present invention, the piezoelectric substrate is made of lithium niobate.

In a preferred embodiment of an acoustic wave device according to the present invention, the piezoelectric substrate includes a piezoelectric film and a higher acoustic velocity material layer directly or indirectly laminated on the piezoelectric film and made of a higher acoustic velocity material in which an acoustic velocity of a bulk wave propagating therein is higher than an acoustic velocity of an acoustic wave propagating in the piezoelectric film.

A preferred embodiment of an acoustic wave device according to the present invention further includes a lower acoustic velocity material layer laminated between the piezoelectric film and the higher acoustic velocity material layer and having a property where an acoustic velocity of a bulk wave propagating therein is lower than an acoustic velocity of the acoustic wave propagating in the piezoelectric film.

With acoustic wave devices according to preferred embodiments of the present invention, the acoustic velocity in the edge regions is able to be reliably reduced even with the interdigital transducer electrode having a large thickness. As a result, the transverse mode ripple is able to be effectively reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified from the following description of preferred embodiments of the present invention with reference to the drawings.

The preferred embodiments described in this Description are merely illustrative and individual elements in the different preferred embodiments can be replaced or combined with each other in any desired manner.

Figure 1:
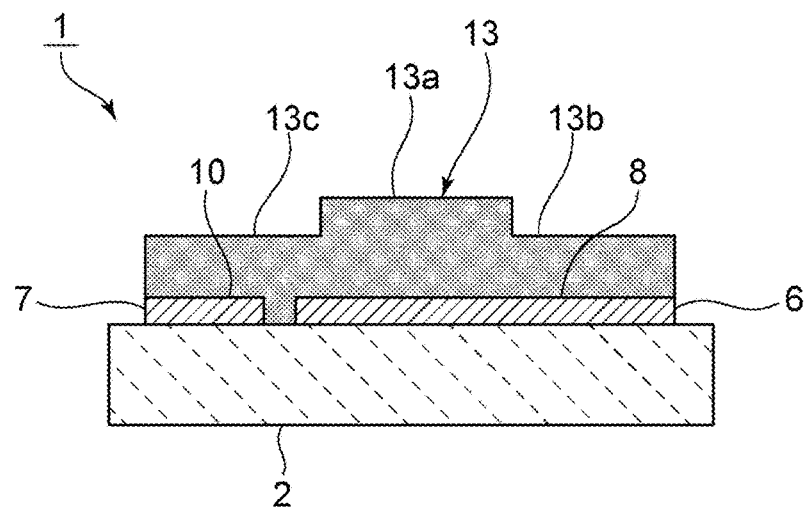
FIG. 1 is a sectional view of an acoustic wave device according to a first preferred embodiment of the present invention, the view taken in an intersecting width direction.
Figure 2:
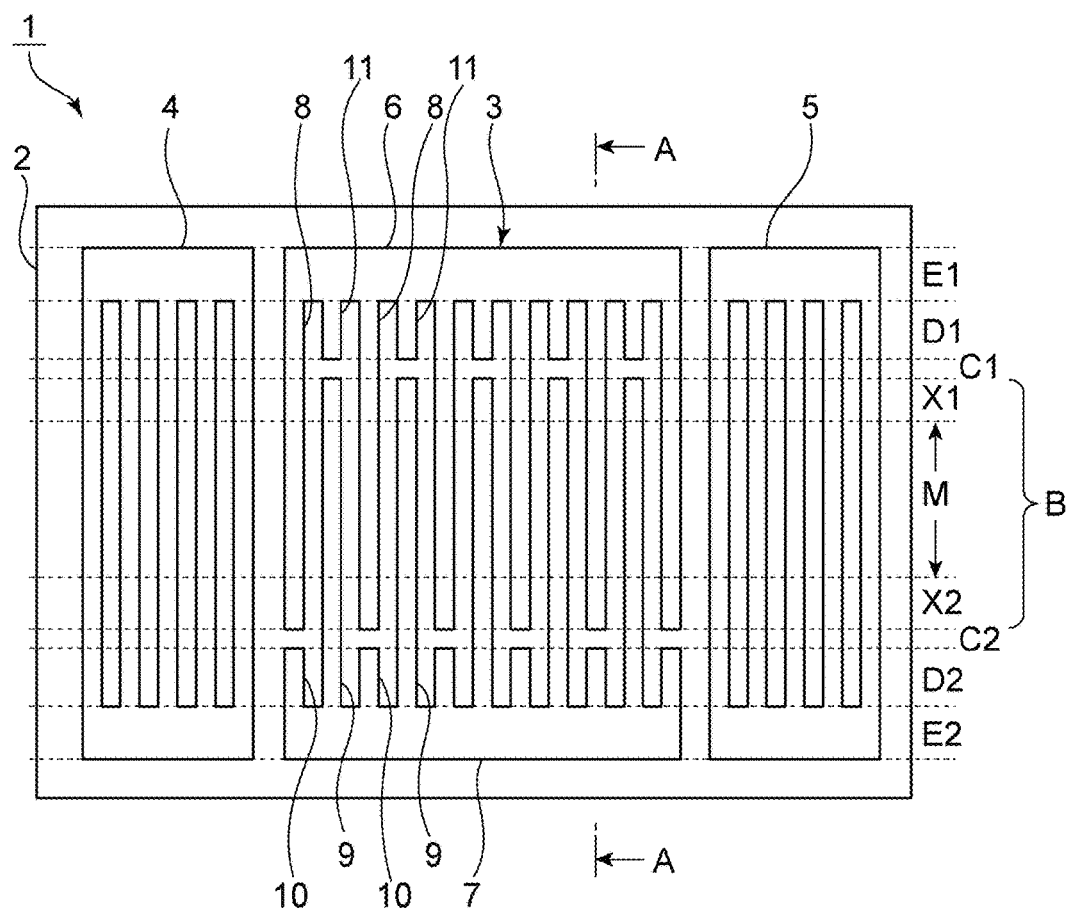
FIG. 2 is a schematic plan view illustrating an electrode structure of the acoustic wave device according to the first preferred embodiment of the present invention.

FIG. 1 is a sectional view of an acoustic wave device according to a first preferred embodiment of the present invention, the view taken in an intersecting width direction, and FIG. 2 is a schematic plan view illustrating an electrode structure of the acoustic wave device according to the first preferred embodiment of the present invention. It is to be noted that, in FIG. 2, a later-described dielectric film is omitted for the sake of clarity. As illustrated in FIGS. 1 and 2, an acoustic wave device 1 includes a piezoelectric substrate 2. In the present preferred embodiment, the piezoelectric substrate 2 is preferably made of lithium niobate ($LiNbO_3$), for example. In preferred embodiments of the present invention, the piezoelectric substrate 2 is preferably made of a material with a reverse velocity surface (the inverse number of SAW-phase velocity) having an elliptic shape. More specifically, the material of the piezoelectric substrate 2 satisfies $kx^2+(1+\Gamma) \times ky^2 = k0^2$ and $\Gamma > -1$. Here, kx denotes a longitudinal component of a wave number vector, ky denotes a transverse component of the wave number vector, and k0 denotes the wave number vector in a main propagation direction.

An interdigital transducer electrode 3 and reflectors 4 and 5 are preferably disposed on the piezoelectric substrate 2. A 1-port acoustic wave resonator is thus defined.

The interdigital transducer electrode 3 preferably includes first and second busbars 6 and 7. One-side ends of a plurality of first electrode fingers 8 are connected to the first busbar 6. One-side ends of a plurality of second electrode fingers 9 are connected to the second busbar 7. The plurality of first electrode fingers 8 and the plurality of second electrode fingers 9 are interdigitated with each other.

The interdigital transducer electrode 3 preferably further includes first and second dummy electrode fingers 10 and 11 although they are not essential. One-side ends of the first dummy electrode fingers 10 are connected to the second busbar 7. Tip ends of the first dummy electrode fingers 10 on the opposite side are opposed to tip ends of the first electrode fingers 8 in a one-to-one relationship with gaps defined therebetween in the intersecting width direction. The gaps correspond to later-described second gap regions.

One-side ends of the second dummy electrode fingers 11 are connected to the first busbar 6. Tip ends of the second dummy electrode fingers 11 on the opposite side are opposed to tip ends of the second electrode fingers 9 in a one-to-one relationship with gaps defined therebetween.

In the acoustic wave device 1, a direction in which an acoustic wave propagates is perpendicular or substantially perpendicular to a direction in which the first and second electrode fingers 8 and 9 extend. When looking at the first electrode fingers 8 and the second electrode fingers 9 from the propagation direction of the acoustic wave, a region where the first electrode fingers 8 and the second electrode fingers 9 overlap with each other is an intersecting region. The size of the intersecting region in the direction in which the first and second electrode fingers 8 and 9 extend is an intersecting width. Thus, in the following description, the extension direction of the first and second electrode fingers 8 and 9 is called the intersecting width direction. The intersecting width direction is perpendicular or substantially perpendicular to the propagation direction of the acoustic wave.

FIG. 1 is a sectional view taken along an arrow-headed line A-A in FIG. 2, namely a sectional view taken along the intersecting width direction. The illustrated section represents a portion in which the first electrode finger 8 and the first dummy electrode finger 10 are opposed to each other with the gap interposed therebetween.

In the acoustic wave device 1, a dielectric film 13 is laminated to cover the interdigital transducer electrode 3. In the present preferred embodiment, the dielectric film 13 is preferably a $SiO_2$ film, i.e., a silicon oxide film, for example. The material of the dielectric film 13 may be another dielectric such as SiON, for example. Furthermore, x in silicon oxide $SiO_x$ may be a value other than 2.

As illustrated in FIG. 1, a film thickness of each of dielectric film portions 13b and 13x positioned in both of the sides in the intersecting width direction is thinner than that of a dielectric film portion 13a positioned at a center in the intersecting width direction.

Here, as illustrated in FIG. 2, various regions of the interdigital transducer electrode 3 along the intersecting width direction are defined as follows. An intersecting region B is, as described above, a region where the first electrode fingers 8 and the second electrode fingers 9 overlap with each other when viewed from the propagation direction of the acoustic wave. The intersecting region B includes a central region M and first and second edge regions X1 and X2. The first edge region X1 is positioned on one outer side of the central region M in the intersecting width direction, and the second edge region X2 is positioned on the other outer side of the central region M in the intersecting width direction.

A first gap region C1 is provided on the one outer side of the intersecting region B in the intersecting width direction, and a second gap region C2 is provided on the other outer side. FIG. 1 illustrates a portion in which the first gap region C1 is defined. As illustrated in FIG. 2, a first dummy region D1 is positioned on the outer side of the first gap region C1 in the intersecting width direction, and a second dummy region D2 is positioned on the outer side of the second gap region C2 in the intersecting width direction. The first and second dummy regions D1 and D2 correspond respectively to portions in which the second dummy electrode fingers 11 and the first dummy electrode fingers 10 are present. A first busbar region E1 is positioned on the outer side of the first dummy region D1 in the intersecting width direction. A second busbar region E2 is positioned on the outer side of the second dummy region D2 in the intersecting width direction.

The dielectric film portion 13a is positioned above the central region M. The dielectric film portion 13b is positioned above a portion ranging from the first edge region X1 to the first busbar region E1. On the other hand, the dielectric film portion 13c is positioned above a portion ranging from the second edge region X2 to the second busbar region E2.

Thus, as viewed in the intersecting region B, the dielectric film portion 13a is positioned in the central region M, and the dielectric film portion 13b and 13c each being relatively thin are positioned respectively in the first and second edge regions X1 and X2.

Up to now, it has been thought that, when the thickness of the dielectric film laminated on the interdigital transducer electrode increases, the acoustic velocity is reduced by the mass addition effect. As described above, however, the inventors of preferred embodiments of the present invention have discovered for the first time that, in the case of the interdigital transducer electrode having a film thickness larger than a certain value, the acoustic velocity increases contrary to the intention when the thickness of the dielectric film is increased.

The acoustic wave device 1 according to the present preferred embodiment is featured in that, assuming an electrode density of the interdigital transducer electrode 3 to be y ($Mg/m^3$) and a wavelength-normalized film thickness $100h/\lambda$ (%) of the interdigital transducer electrode 3 to be x (%), the wavelength-normalized film thickness x of the interdigital transducer electrode 3 has a value not less than x satisfying $y = 0.3452x^2 - 6.0964x + 36.262$ (equation 1) depending on the electrode density y of the interdigital transducer electrode 3. Under such a condition, the acoustic velocity in each of the first and second edge regions X1 and X2 becomes lower than that in the central region M. It is thus possible to effectively reduce or prevent a transverse mode based on a difference in the acoustic velocity, and to reduce or prevent a transverse mode ripple. The above point will be described in more detail below.

Figure 3:
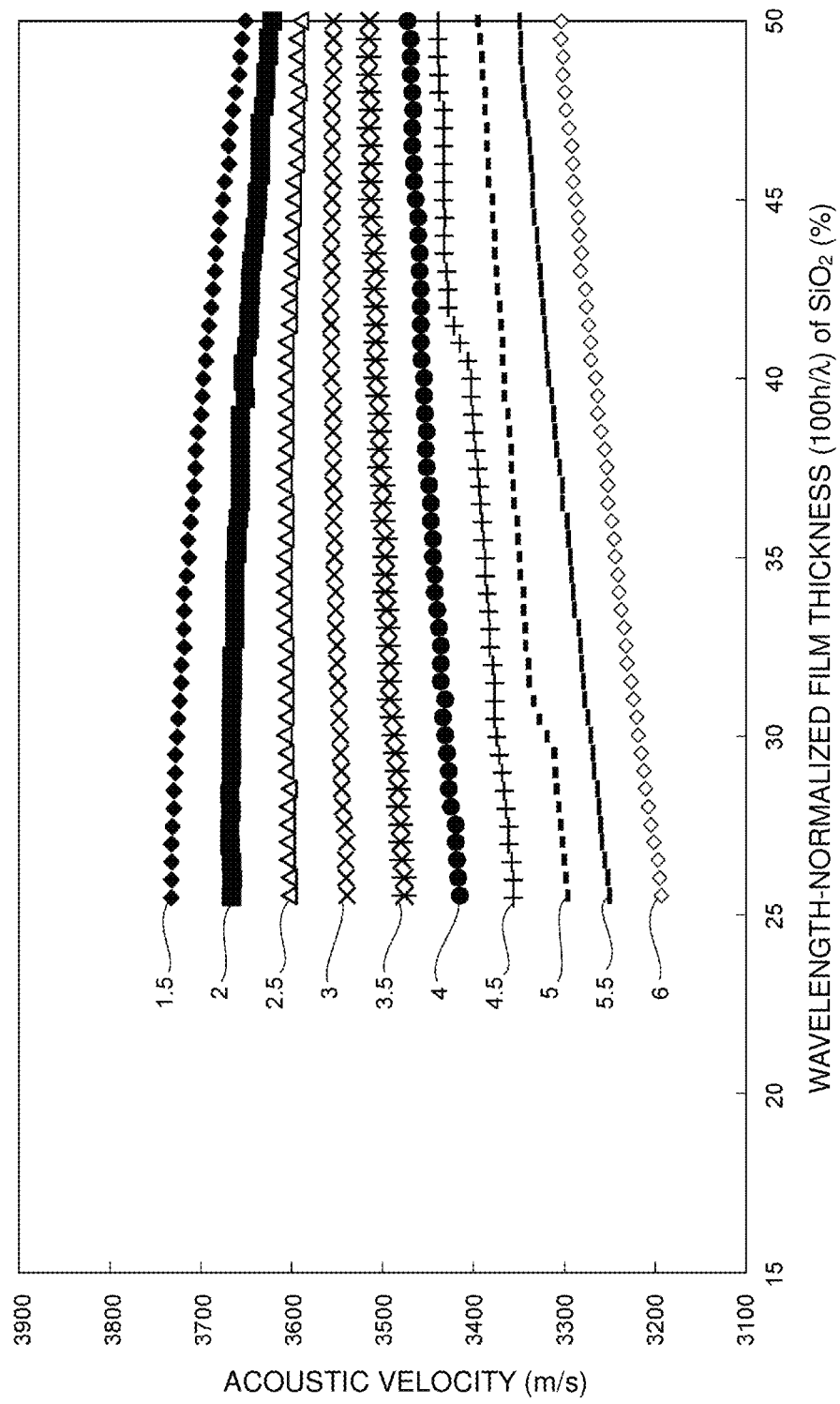
FIG. 3 is a graph showing the relationship between a wavelength-normalized film thickness $100h/\lambda$ (%) of a $SiO_2$ film and the acoustic velocity (m/sec) of an acoustic wave when an interdigital transducer electrode is made of Pt.

FIG. 3 is a graph representing a relationship between a wavelength-normalized film thickness $100h/\lambda$ (%) of a $SiO_2$ film and the acoustic velocity (m/sec) of an acoustic wave when the interdigital transducer electrode is made of Pt. The $SiO_2$ film covers the entirety or substantially the entirety of the interdigital transducer electrode and includes an upper flat surface. In the wavelength-normalized film thickness $100h/\lambda$ (%) of the $SiO_2$ film, h denotes a thickness of the $SiO_2$ film, and $\lambda$ denotes a wavelength that is determined by an electrode finger pitch of the interdigital transducer electrode. FIG. 3 represents the results when the wavelength-normalized film thickness of the interdigital transducer electrode 3 is set to about 1.5%, about 2%, about 2.5%, about 3%, about 3.5%, about 4%, about 4.5%, about 5%, about 5.5%, and about 6% in terms of 100h/λ (%).

As seen from FIG. 3, in the case of the interdigital transducer electrode 3 being made of Pt, when the wavelength-normalized film thickness of the interdigital transducer electrode 3 is less than about 3%, the acoustic velocity reduces with an increase in the wavelength-normalized film thickness of the $SiO_2$ film. In other words, the above result is the same as that obtained with the knowledge so far known in the art.

However, it is also seen that, when the wavelength-normalized film thickness of the interdigital transducer electrode 3 is not less than about 3%, the acoustic velocity increases with an increase in the wavelength-normalized film thickness of the $SiO_2$ film.

In the acoustic wave device 1, the wavelength-normalized film thickness x of the interdigital transducer electrode 3 has a value not less than x satisfying the above equation 1. When the wavelength-normalized film thickness of the interdigital transducer electrode 3 represented in FIG. 3 is about 3%, the equation 1 is satisfied. Accordingly, in the case of the interdigital transducer electrode 3 being made of Pt, x satisfying the above equation 1 is about 3%.

Thus, with the film thickness of each of the dielectric film portions 13b and 13c in the first and second edge regions X1 and X2 being thinner than that of the dielectric film portion 13a in the central region M as illustrated in FIGS. 1 and 2, the acoustic velocity in each of the first and second edge regions X1 and X2 becomes lower than that in the central region M. In other words, since the first and second edge regions X1 and X2 are provided as regions where the acoustic velocity is lower than that in the central region M, the transverse mode is able to be reduced or prevented by utilizing a piston mode.

In the first and second gap regions C1 and C2, only either ones of the first electrode fingers 8 and the second electrode fingers 9 are present in the propagation direction of the acoustic wave. Accordingly, the acoustic velocity in the first and second gap regions C1 and C2 is higher than that in the first and second edge regions X1 and X2. Furthermore, since the second dummy electrode fingers 11 and the first dummy electrode fingers 10 are disposed respectively in the first and second dummy regions D1 and D2, the acoustic velocity in the first and second dummy regions D1 and D2 is equal or substantially equal to that in the first and second edge regions X1 and X2. In addition, since the first and second busbar regions E1 and E2 positioned on the outermost side in the intersecting width direction are entirely metallized, the acoustic velocity in the first and second busbar regions E1 and E2 is lower than that in the first and second dummy regions D1 and D2.

Figure 4:
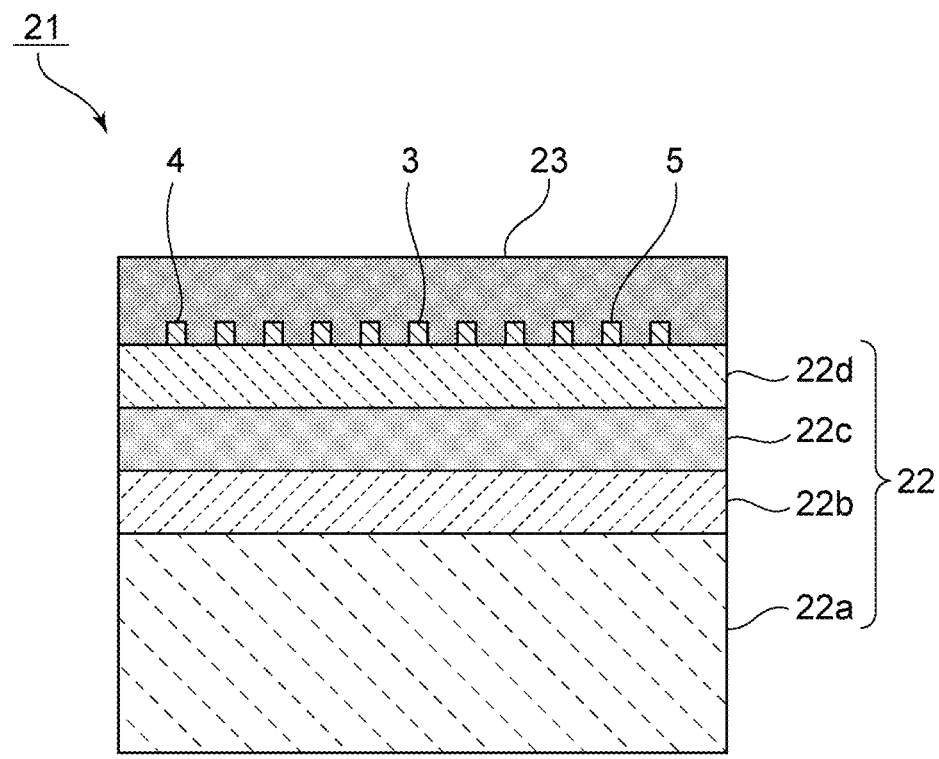
FIG. 4 is a front sectional view referenced to explain an acoustic wave device according to a second preferred embodiment of the present invention.
Figure 5:
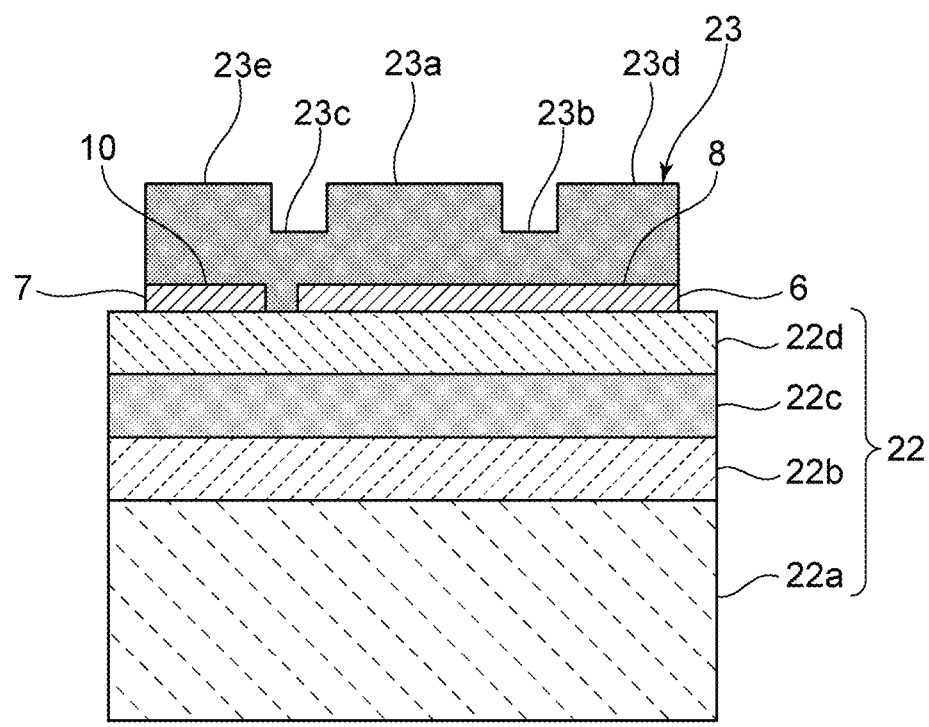
FIG. 5 is a sectional view of the acoustic wave device according to the second preferred embodiment of the present invention, the view taken in the intersecting width direction.

FIG. 4 is a front sectional view of an acoustic wave device according to a second preferred embodiment of the present invention, and FIG. 5 is a sectional view of the acoustic wave device, the view taken in the intersecting width direction. In the acoustic wave device 21 according to the second preferred embodiment, a piezoelectric substrate 22 preferably includes a structure in which a higher acoustic velocity material layer 22b, a lower acoustic velocity material layer 22c, and a piezoelectric film 22d are successively laminated on a support substrate 22a in that order.

The piezoelectric film 22d is preferably made of lithium tantalate ($LiTaO_3$), for example. The lower acoustic velocity material layer 22c is made of a material in which the acoustic velocity of a bulk wave propagating therein is lower than that of an acoustic wave propagating in the piezoelectric film 22d. The higher acoustic velocity material layer 22b is made of a material in which the acoustic velocity of a bulk wave propagating therein is higher than that of the acoustic wave propagating in the piezoelectric film 22d. The materials of the lower acoustic velocity material layer 22c and the higher acoustic velocity material layer 22b are not limited to particular ones, and various materials including not only appropriate ceramics, such as alumina, silicon oxide, silicon oxynitride, and silicon nitride, but also DLC can be optionally used, for example. In other words, the higher acoustic velocity material layer 22b and the lower acoustic velocity material layer 22c can be made by using appropriate materials insofar as the above-described acoustic velocity relationship is satisfied.

The support substrate 22a is preferably made of an appropriate material such as silicon or alumina, for example. When the support substrate 22a is made of the higher acoustic velocity material, the higher acoustic velocity material layer 22b may be omitted. The lower acoustic velocity material layer 22c is not essential and it may be omitted.

Thus, the piezoelectric film 22d may be laminated on the support substrate 22a and the higher acoustic velocity material layer 22b. In an alternative structure, the piezoelectric film 22d may be laminated on the support substrate made of the higher acoustic velocity material.

Even when the piezoelectric film 22d is made of lithium tantalate as described above, the reverse velocity surface of the piezoelectric substrate 22 has an elliptic shape if the higher acoustic velocity material layer 22b is at least in a directly or indirectly laminated relationship to the piezoelectric film 22d. Also in this case, therefore, if the wavelength-normalized film thickness of the interdigital transducer electrode 3 is not less than a certain value depending on the electrode density, the acoustic velocity of the acoustic wave increases with an increase in thickness of a dielectric film as in the case of the first preferred embodiment.

In the acoustic wave device 21 according to the second preferred embodiment, a dielectric film 23 preferably includes relatively thick dielectric film portions 23a, 23d and 23e and relatively thin dielectric film portions 23b and 23c. The dielectric film portions 23b and 23c are positioned in regions corresponding to the first and second edge regions X1 and X2 illustrated in FIG. 1, respectively. Accordingly, also in the acoustic wave device 21 according to the second preferred embodiment, it is possible to effectively reduce or prevent the transverse mode based on a difference in acoustic velocity between the central region M and the first and second edge regions X1 and X2.

As illustrated in FIG. 5, a thickness of each of the dielectric film portions 23d and 23e in the first and second dummy regions and the first and second busbar regions may be equal or substantially equal to that of the dielectric film portion 23a in the central region. In other words, the thickness of the dielectric film in the outer regions than the first and second edge regions in the intersecting width direction may be thicker than that of the dielectric film in the first and second edge regions.

The film thickness of each of the dielectric film portions 23d and 23e may be different from that of the dielectric film portion 23a. However, when the dielectric film portion 23a and the dielectric film portions 23d and 23e have the same or substantially the same film thickness, a manufacturing process is able to be simplified.

While the acoustic wave devices 1 and 21 according to the first and second preferred embodiments have been described with reference to the 1-port acoustic wave resonator, the acoustic wave device of the present invention may be another type of acoustic wave device, such as an acoustic wave filter of longitudinally coupled resonator device, for example.

The point that, in the case of the interdigital transducer electrode 3 being made of suitable one of other various metals or a multilayer metal film, the advantageous effects of preferred embodiments of the present invention can also be obtained as described above when the electrode film thickness has a value not less than x satisfying the above equation 1 will be described below with reference to FIGS. 6 to 13.

FIGS. 6 to 10 are each a graph representing a relationship between the wavelength-normalized film thickness 100h/λ (%) of the $SiO_2$ film and the acoustic velocity (m/sec) of the acoustic wave when the interdigital transducer electrode is made of Au, W, Ta, Mo or Cu. Also in FIGS. 6 to 10, the $SiO_2$ film covers the entirety or substantially the entirety of the interdigital transducer electrode and includes an upper flat surface.

Figure 6:
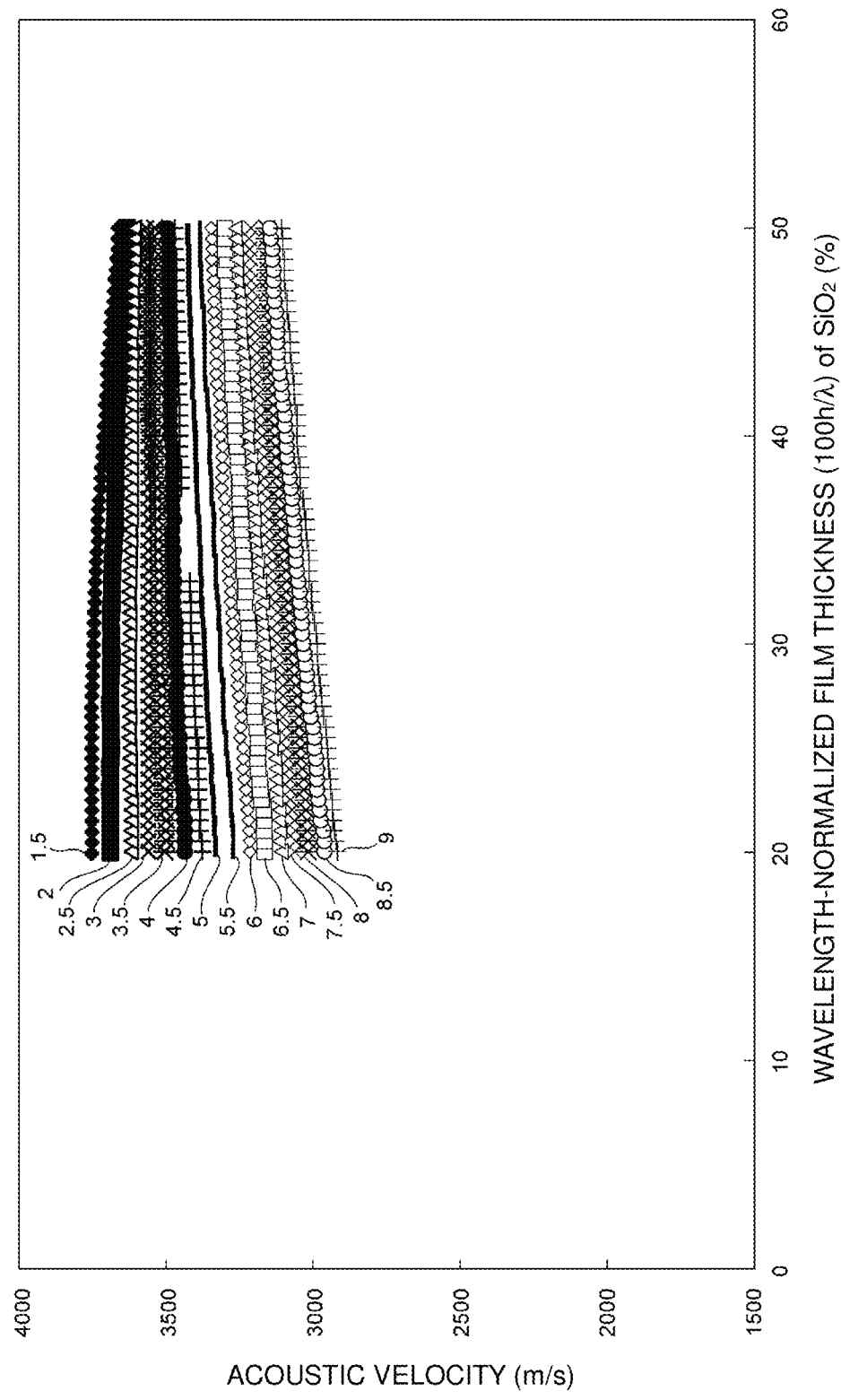
FIG. 6 is a graph showing the relationship between the wavelength-normalized film thickness $100h/\lambda$ (%) of the $SiO_2$ film and the acoustic velocity (m/sec) of the acoustic wave when the interdigital transducer electrode is made of Au.
Figure 7:
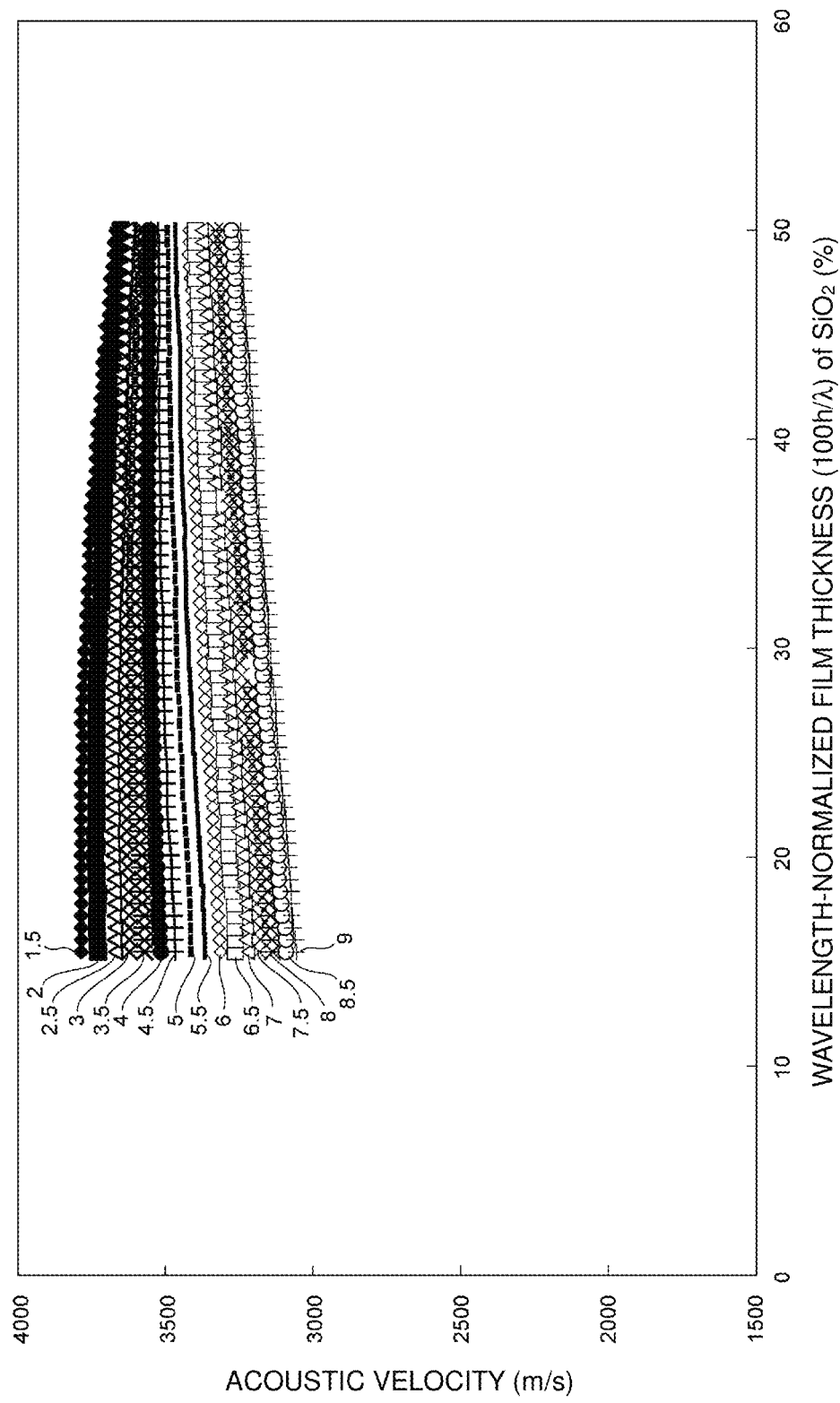
FIG. 7 is a graph showing the relationship between the wavelength-normalized film thickness $100h/\lambda$ (%) of the $SiO_2$ film and the acoustic velocity (m/sec) of the acoustic wave when the interdigital transducer electrode is made of W.
Figure 8:
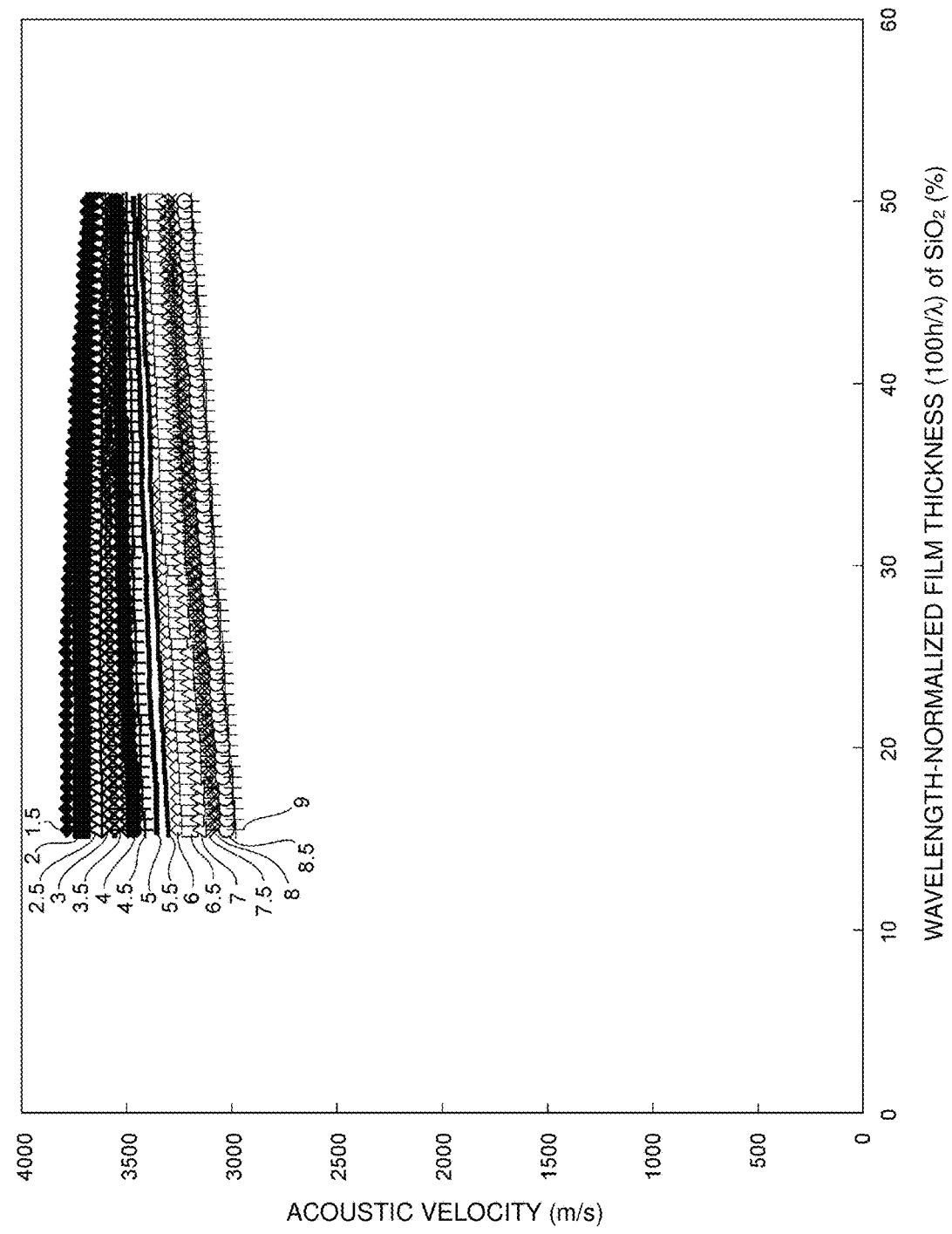
FIG. 8 is a graph showing the relationship between the wavelength-normalized film thickness $100h/\lambda$ (%) of the $SiO_2$ film and the acoustic velocity (m/sec) of the acoustic wave when the interdigital transducer electrode is made of Ta.

As seen from FIG. 6, in the case of using Au, the acoustic velocity increases with an increase in the wavelength-normalized film thickness (%) of the $SiO_2$ film when x is not less than about 3.5%. It is thus understood that x satisfying the above equation 1 needs to be not less than about 3.5%. Similarly, as seen from FIG. 7, in the case of using W, x needs to be not less than about 3.5%. Furthermore, as seen from FIG. 8, in the case of using Ta, x needs to be not less than about 4%.

Figure 9:
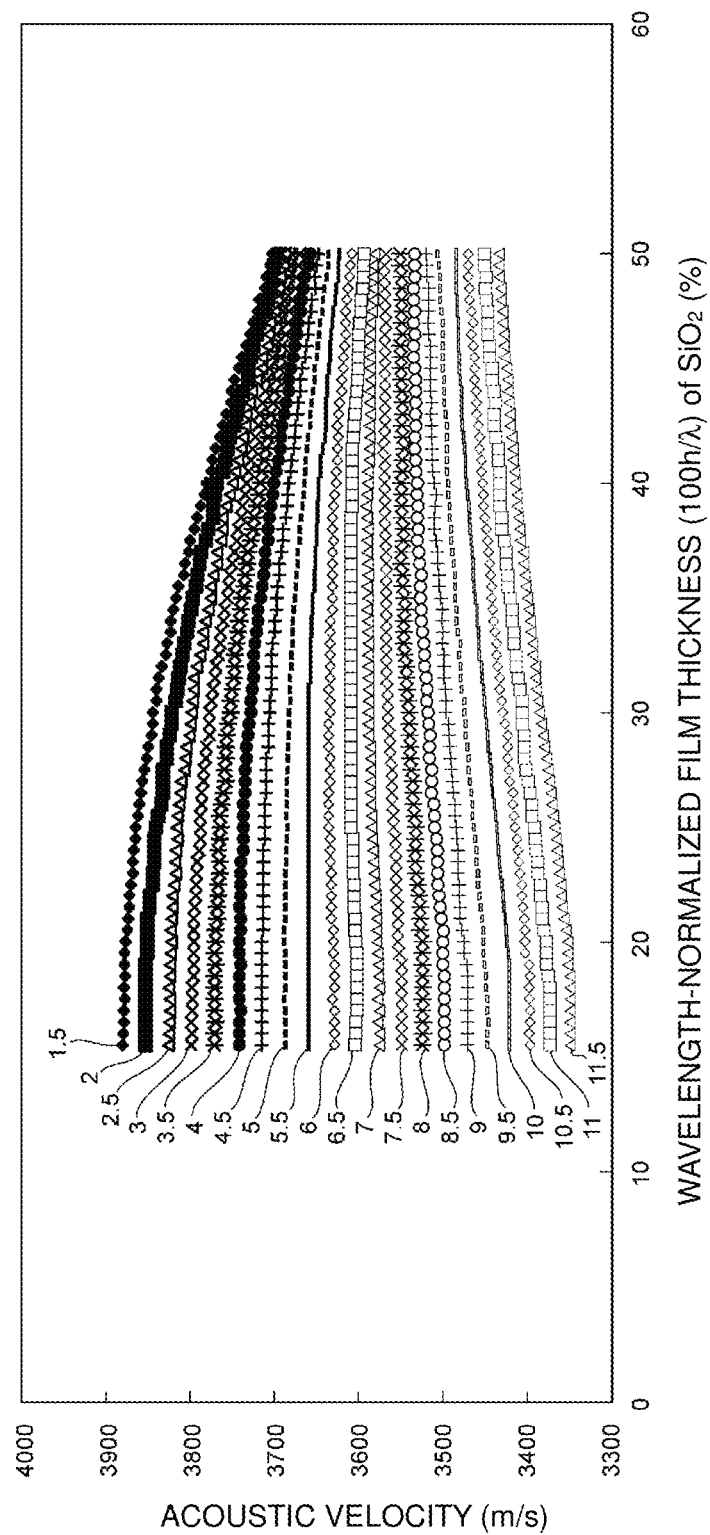
FIG. 9 is a graph showing the relationship between the wavelength-normalized film thickness $100h/\lambda$ (%) of the $SiO_2$ film and the acoustic velocity (m/sec) of the acoustic wave when the interdigital transducer electrode is made of Mo.
Figure 10:
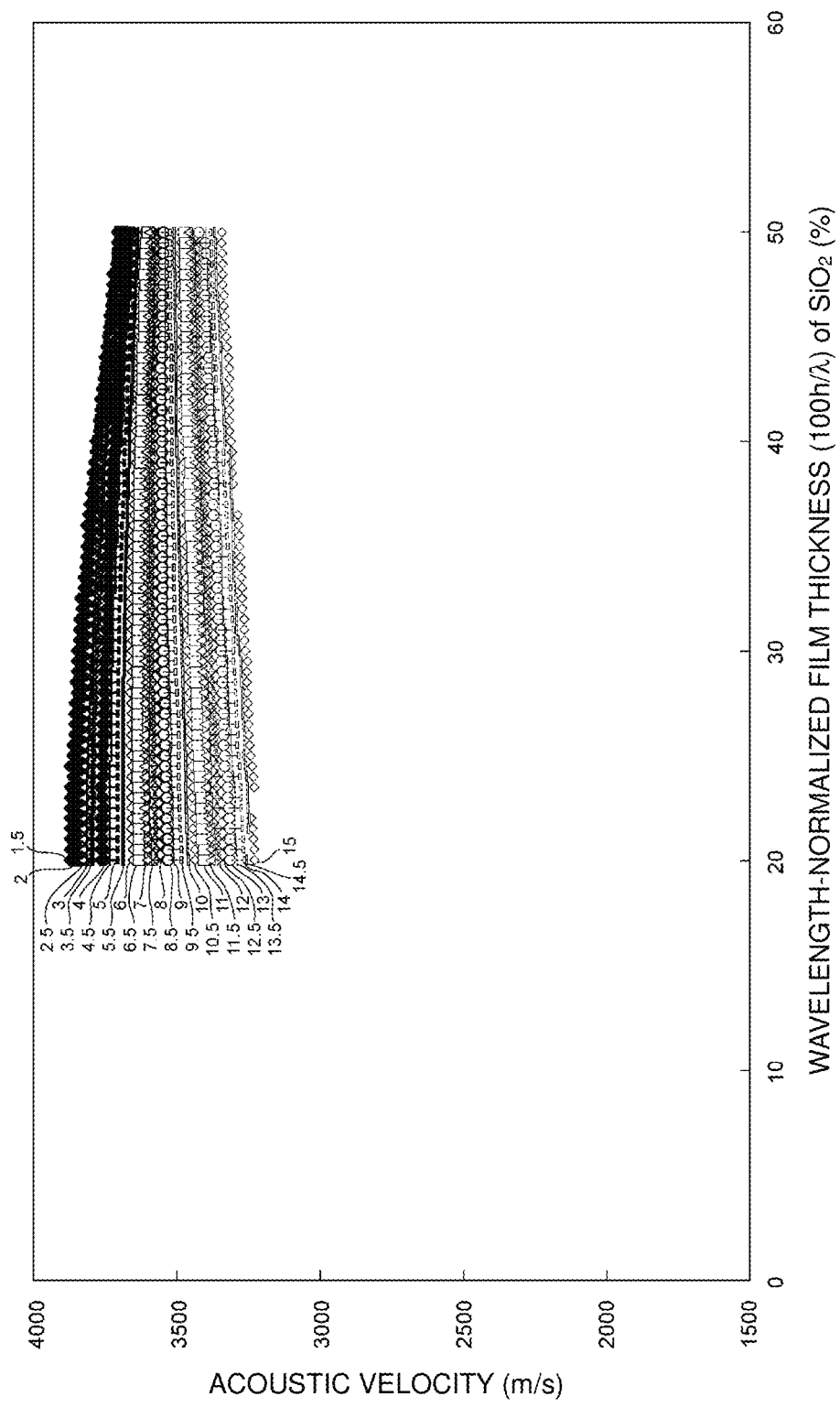
FIG. 10 is a graph showing the relationship between the wavelength-normalized film thickness $100h/\lambda$ (%) of the $SiO_2$ film and the acoustic velocity (m/sec) of the acoustic wave when the interdigital transducer electrode is made of Cu.

As seen from FIG. 9, in the case of using Mo, x needs to be not less than about 8%. As seen from FIG. 10, in the case of using Cu, x needs to be not less than about 9%. Thus, as listed in Table 2 below, when the interdigital transducer electrode is made of Pt, W, Mo, Ta, Au or Cu, x needs to be not less than a value denoted in Table 2 depending on each of the electrode materials.

TABLE 2

| Material | x = 100 h/λ (%) |
|---|---|
| Pt | ≥3 |
| W | ≥3.5 |
| Mo | ≥8 |
| Ta | ≥4 |
| Au | ≥3.5 |
| Cu | ≥9 |

Figure 13:
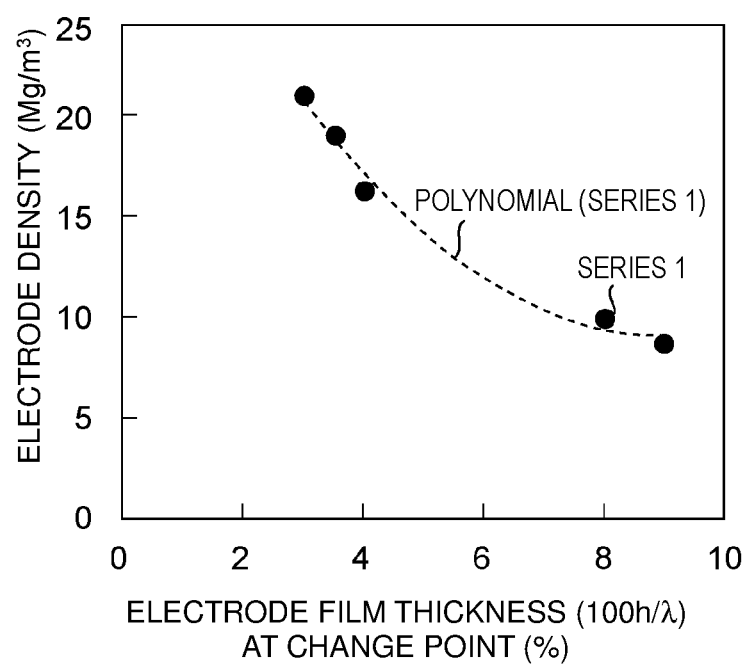
FIG. 13 is a graph showing the relationship between a wavelength-normalized film thickness $100h/\lambda$ (%) of an electrode and an electrode density ($Mg/m^3$) at a lower limit value in a range in which the acoustic velocity reduces with respect to an increase in film thickness of $SiO_2$ film.

FIG. 13 is a graph representing a relationship between a lower limit value of x and an electrode density of the interdigital transducer electrode 3. A curve depicted in FIG. 13 represents the equation 1. Thus, in the case of the interdigital transducer electrode 3 having a certain electrode density, the transverse mode ripple is able to be reduced or prevented by adjusting the film thickness of the dielectric film in accordance with the present invention when a point denoting the electrode film thickness on the graph is positioned rightward of a corresponding point on the curve in FIG. 13, namely when the electrode film thickness is not less than a value corresponding to the point on the curve.

Figure 11:
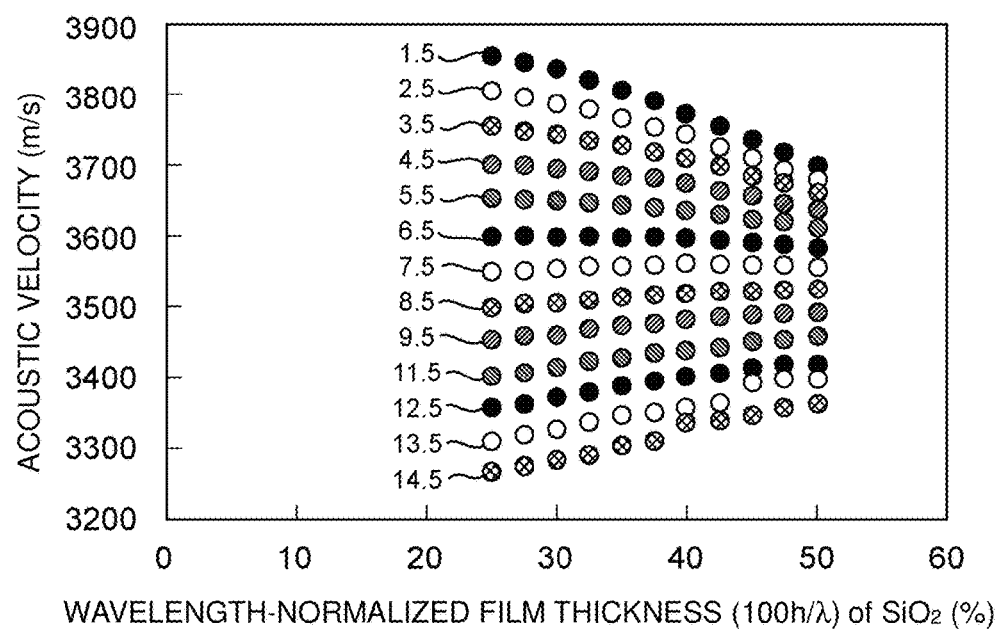
FIG. 11 is a graph showing the relationship between the wavelength-normalized film thickness $100h/\lambda$ (%) of the $SiO_2$ film and the acoustic velocity (m/sec) of the acoustic wave when the interdigital transducer electrode is made of a multilayer metal film made of a Mo film and an Al film.
Figure 12:
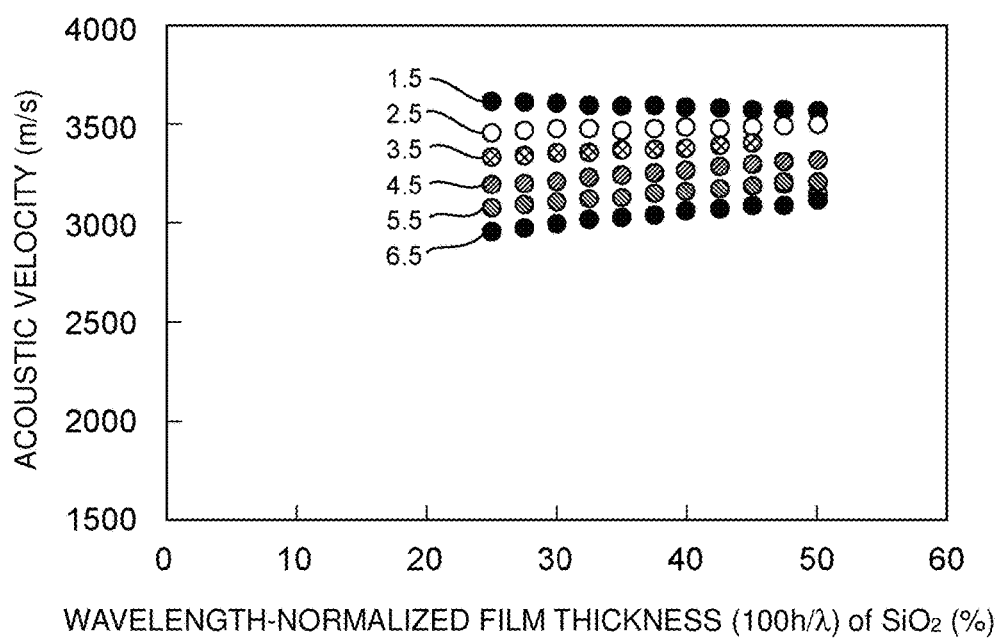
FIG. 12 is a graph showing the relationship between the wavelength-normalized film thickness $100h/\lambda$ (%) of the $SiO_2$ film and the acoustic velocity (m/sec) of the acoustic wave when the interdigital transducer electrode is made of a multilayer metal film made of a Pt film and an Al film.

The interdigital transducer electrode 3 may be made of the multilayer metal film that includes a plurality of metal films that are laminated. Examples in the case of using the multilayer metal film are illustrated in FIGS. 11 and 12. FIG. 11 represents an example of the case in which the multilayer metal film is made of a Mo film and an Al film. FIG. 11 is a graph representing a relationship between the wavelength-normalized film thickness 100h/λ (%) of the $SiO_2$ film and the acoustic velocity of the acoustic wave.

Here, a wavelength-normalized film thickness of the entire multilayer metal film is set to about 1.5%, about 2.5%, about 3.5%, about 4.5%, about 5.5%, about 6.5%, about 7.5%, about 8.5%, about 9.5%, about 11.5%, about 12.5%, about 13.5%, or about 14.5%, and the wavelength-normalized film thickness of the $SiO_2$ film is set to about 25%, about 27.5%, about 30%, about 32.5%, about 35%, about 37.5%, about 40%, about 42.5%, about 45%, about 47.5%, or 50%. The electrode density is changed by changing a film thickness of the Mo film while a film thickness of the Al film is maintained constant.

FIG. 12 represents an example of the case in which the multilayer metal film is made of a Pt film and an Al film. FIG. 12 is a graph representing a relationship between the wavelength-normalized film thickness 100h/λ (%) of the $SiO_2$ film and the acoustic velocity of the acoustic wave. Here, the wavelength-normalized film thickness of the entire multilayer metal film is set to about 1.5%, about 2.5%, about 3.5%, about 4.5%, about 5.5%, or about 6.5%. The wavelength-normalized film thickness of the $SiO_2$ film is set to about 25%, about 27.5%, about 30%, about 32.5%, about 35%, about 37.5%, about 40%, about 42.5%, about 45%, about 47.5%, or about 50%. The electrode density is changed by changing a film thickness of the Pt film while a film thickness of the Al film is maintained constant.

As seen from FIG. 11, in the case of the multilayer metal film made of the Mo film and the Al film, x (%) needs to be not less than about 7.5%. As seen from FIG. 12, in the case of the multilayer metal film made of the Pt film and the Al film, x (%) needs to be not less than about 2.5%. In other words, lower limit values are each in agreement with x (%) satisfying the equation 1.

Thus, in the case of using the multilayer metal film, a density of the entire multilayer metal film is determined from the densities and the film thicknesses of electrode materials constituting the multilayer metal film. A lower limit value x (%) of the wavelength-normalized film thickness of the interdigital transducer electrode 3 made of the multilayer metal film is determined from the above determined density.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate with a reverse velocity surface having an elliptic shape;
   an interdigital transducer electrode disposed on or above the piezoelectric substrate; and
   a dielectric film disposed on the piezoelectric substrate to cover the interdigital transducer electrode, the acoustic wave device utilizing a Rayleigh wave; wherein
   the interdigital transducer electrode includes first electrode fingers and second electrode fingers interdigitated with the first electrode fingers, and where a direction perpendicular or substantially perpendicular to an extension direction of the first electrode fingers and the second electrode fingers is a propagation direction of an acoustic wave, a region in which the first electrode fingers and the second electrode fingers overlap with each other when viewed from the propagation direction of the acoustic wave is an intersecting region, the extension direction of the first and second electrode fingers is an intersecting width direction, and an electrode density ($Mg/m^3$) of the interdigital transducer electrode is denoted by y ($Mg/m^3$) and a wavelength-normalized film thickness 100h/λ (%) of the interdigital transducer electrode, where h denotes a thickness and λ denotes a wavelength determined by an electrode finger pitch of the interdigital transducer electrode, is denoted by x (%), the wavelength-normalized film thickness x of the interdigital transducer electrode has a value not less than x satisfying $y=0.3452x^2-6.0964x+36.262$ depending on the electrode density y of the interdigital transducer electrode;

the intersecting region of the interdigital transducer electrode includes a central region positioned at a center portion in the intersecting width direction and a first edge region and a second edge region positioned respectively on one outer side and another outer side of the central region in the intersecting width direction;

a film thickness of the dielectric film in each of the first edge region and the second edge region is thinner than a film thickness of the dielectric film in the central region; and the dielectric film is made of silicon oxide.

2. The acoustic wave device according to claim 1, wherein the interdigital transducer electrode is made of Pt, W, Mo, Ta, Au or Cu, and the wavelength-normalized film thickness x of the interdigital transducer electrode is set to be not less than a value in Table 1 below depending on each of materials from which the interdigital transducer electrode is made:

TABLE 1

| Material | x = 100 h/λ (%) |
|---|---|
| Pt | ≥3 |
| W | ≥3.5 |
| Mo | ≥8 |
| Ta | ≥4 |
| Au | ≥3.5 |
| Cu | ≥9. |

3. The acoustic wave device according to claim 1, wherein the interdigital transducer electrode is made of a multilayer metal film including a plurality of metal films that are laminated, and y (%) in $y=0.3452x^2-6.0964x+36.262$ denotes a density of the multilayer metal film.

4. The acoustic wave device according to claim 1, wherein regions in which the film thickness of the dielectric film is thicker than the film thickness of the dielectric film in each of the first edge region and the second edge region of the interdigital transducer electrode are positioned on outer sides of the first edge region and the second edge region in the intersecting width direction.

5. The acoustic wave device according to claim 4, further comprising:

a first gap region and a second gap region, in which only the first electrode fingers or the second electrode fingers are present, positioned on outer sides of the first edge region and the second edge region in the intersecting width direction;

a first dummy electrode finger including a tip end opposed to a tip end of one of the second electrode fingers with the second gap region interposed therebetween; and a second dummy electrode finger including a tip end opposed to a tip end of one of the first electrode fingers with the first gap region interposed therebetween; wherein the first dummy electrode finger and the second dummy electrode finger are positioned respectively on outer sides of the first gap region and the second gap region in the intersecting width direction.

6. The acoustic wave device according to claim 1, wherein a first gap region and a second gap region in which only the first electrode fingers or the second electrode fingers are present are positioned on outer sides of the first edge region and the second edge region in the intersecting width direction.

7. The acoustic wave device according to claim 6, further comprising:

a first dummy electrode finger including a tip end opposed to a tip end of one of the second electrode fingers with the second gap region interposed therebetween; and a second dummy electrode finger including a tip end opposed to a tip end of one of the first electrode fingers with the first gap region interposed therebetween, wherein the first dummy electrode finger and the second dummy electrode finger are positioned respectively on outer sides of the first gap region and the second gap region in the intersecting width direction.

8. The acoustic wave device according to claim 7, wherein the interdigital transducer electrode includes a first busbar and a second busbar, the first busbar being connected to the first electrode fingers and the first dummy electrode finger and the second busbar being connected to the second electrode fingers and the second dummy electrode finger.

9. The acoustic wave device according to claim 6, further comprising:

a first dummy electrode finger including a tip end opposed to a tip end of one of the second electrode fingers with the second gap region interposed therebetween; and a second dummy electrode finger including a tip end opposed to a tip end of one of the first electrode fingers with the first gap region interposed therebetween; wherein the first dummy electrode finger and the second dummy electrode finger are positioned respectively on outer sides of the first gap region and the second gap region in the intersecting width direction; and regions in which the film thickness of the dielectric film is thicker than the film thickness of other regions of the dielectric film are provided over the first dummy electrode finger and the second dummy electrode finger.

10. The acoustic wave device according to claim 1, wherein the piezoelectric substrate is made of lithium niobate.

11. The acoustic wave device according to claim 1, wherein the piezoelectric substrate includes a piezoelectric film and a higher acoustic velocity material layer directly or indirectly laminated on the piezoelectric film and made of a higher acoustic velocity material in which an acoustic velocity of a bulk wave propagating therein is higher than acoustic velocity of an acoustic wave propagating in the piezoelectric film.

12. The acoustic wave device according to claim 11, further comprising a lower acoustic velocity material layer laminated between the piezoelectric film and the higher acoustic velocity material layer and having a property where an acoustic velocity of a bulk wave propagating therein is lower than the acoustic velocity of the acoustic wave propagating in the piezoelectric film.

13. The acoustic wave device according to claim 12, wherein
    the lower acoustic velocity material layer is made from one of alumina, silicon oxide, silicon oxynitride, silicon nitride, and DLC; and
    the higher acoustic velocity material layer is made from one of alumina, silicon oxide, silicon oxynitride, silicon nitride, and DLC.

14. The acoustic wave device according to claim 11, wherein
    the piezoelectric film is made of lithium tantalate.

15. The acoustic wave device according to claim 11, wherein the piezoelectric substrate further includes a support substrate made of silicon or alumina.

16. The acoustic wave device according to claim 1, further comprising reflectors positioned on or above the piezoelectric substrate and adjacent to the interdigital transducer electrode in the propagation direction of the acoustic wave.

17. The acoustic wave device according to claim 1, wherein the dielectric film is a $SiO_2$ film.

18. The acoustic wave device according to claim 1, wherein the interdigital transducer electrode is made of a multilayer metal film including a plurality of metal films that are laminated.

19. The acoustic wave device according to claim 18, wherein the plurality of metal films includes at least two of a Pt film, an Al film, and an Mo film.

* * * * *